United States Patent
Choi et al.

(10) Patent No.: US 7,576,809 B2
(45) Date of Patent: Aug. 18, 2009

(54) ARRAY SUBSTRATE FOR LIQUID CRYSTAL DISPLAY DEVICE AND MANUFACTURING METHOD THEREOF

(75) Inventors: Seung-Kyu Choi, Daegu (KR); Young-Hun Ha, Gyeongsangbuk-do (KR); Jong-Woo Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 309 days.

(21) Appl. No.: 11/348,449

(22) Filed: Feb. 7, 2006

(65) Prior Publication Data

US 2006/0128047 A1    Jun. 15, 2006

Related U.S. Application Data

(62) Division of application No. 10/028,667, filed on Dec. 28, 2001, now Pat. No. 7,019,797.

(30) Foreign Application Priority Data

Dec. 29, 2000   (KR) ............................... 2000-86332

(51) Int. Cl.
    *G02F 1/136*   (2006.01)
(52) U.S. Cl. ......................................... 349/43; 349/38
(58) Field of Classification Search .................... 349/43, 349/38
    See application file for complete search history.

(56) References Cited

U.S. PATENT DOCUMENTS

| | | | |
|---|---|---|---|
| 5,926,235 A | 7/1999 | Han et al. | |
| 6,025,605 A | 2/2000 | Lyu | |
| 6,091,466 A | 7/2000 | Kim et al. | |
| 6,380,559 B1 * | 4/2002 | Park et al. | 257/59 |
| 6,414,730 B1 * | 7/2002 | Akamatsu et al. | 349/43 |
| 6,509,940 B2 | 1/2003 | Kwak et al. | |
| 2001/0019376 A1 | 9/2001 | Kim | |

* cited by examiner

*Primary Examiner*—Richard H Kim
(74) *Attorney, Agent, or Firm*—Birch, Stewart, Kolasch & Birch, LLP

(57) ABSTRACT

A fabricating method of an array substrate for a liquid crystal display device includes forming a gate line on a substrate; forming an ohmic contact layer on the substrate; forming a data line and source and drain electrodes on the ohmic contact layer, the source electrode being connected to the data line, the source and drain electrodes facing and spaced apart from each other; forming a passivation layer having a contact hole on the data line and the source and drain electrodes, the contact hole exposing a portion of a side surface of the drain electrode; and forming a pixel electrode on the passivation layer, the pixel electrode being connected to the drain electrode through the contact hole.

5 Claims, 9 Drawing Sheets

ARRAY SUBSTRATE FOR LIQUID CRYSTAL DISPLAY DEVICE AND MANUFACTURING METHOD THEREOF

CROSS REFERENCE

This application claims the benefit of Korean Patent Application No. 2000-86332, filed on Dec. 29, 2000, under 35 U.S.C. § 119, the entirety of which is hereby incorporated by reference. This application is a Divisional of application Ser. No. 10/028,667, filed on Dec. 28, 2001 now U.S. Pat. No. 7,019,797, the entire contents of which are hereby incorporated by reference and for which priority is claimed under 35 U.S.C. §120.

BACKGROUND OF THE INVENTION

1. Field of the Invention

The present invention relates to a liquid crystal display device, and more particularly to an array substrate for a liquid crystal display device having good contact property and high aperture ratio.

2. Description of Related Art

Generally, conventional liquid crystal display (LCD) devices include upper and lower substrates with liquid crystal molecules interposed therebetween. The upper and lower substrates are generally referred to as a color filter substrate and an array substrate, respectively. The upper and lower substrates respectively include electrodes disposed on opposing surfaces of the upper and lower substrates. An electric field is generated by applying a voltage to the electrodes, thereby driving the liquid crystal molecules to display images depending on the light transmittance.

Among the different types of known LCDs, active matrix LCDs (AM-LCDs), which have thin film transistors and pixel electrodes arranged in a matrix form, are the subject of significant research and development because of their high resolution and superiority in displaying moving images. The conventional AM-LCD devices, in which the liquid crystal layer is driven by the electric field perpendicular to the upper and lower substrates, have a high transmittance and a high aperture ratio and the common electrode of the upper substrate is grounded so that the break of the devices due to the static electricity can be prevented.

On the other hand, the lower substrate of the LCD device is formed by repeatedly depositing and etching the thin film layer. Usually, the number of masks used in photolithography processs is about 5 or 6 and represents the number of processes.

FIG. 1 is a schematic plan view of an array (lower) substrate for a conventional LCD device and FIG. 2 is a schematic cross-sectional view taken along a line "II-II" of FIG. 1.

In FIGS. 1 and 2, a gate line 21 along a row direction and a gate electrode 22 extended from the gate line 21 are formed on a substrate 10. Then, a gate insulator 30 is formed on the gate line 21 and the gate electrode 22. Subsequently, an active layer 41 and an ohmic contact layer 51 and 52 are formed on the gate insulator 30. On the ohmic contact layer 51 and 52, a data line 61, source and drain electrodes 62 and 63 and a storage electrode 65 are formed. The data line 61 is disposed perpendicular to the gate line 21, the source electrode 62 is extended from the data line 61, the drain electrode 63 is facing and spaced apart from the source electrode 62, and the storage electrode 65 overlaps the gate line 21. The data line 61, source and drain electrodes 62 and 63 and the storage electrode 65 are covered with a passivation layer 70 having first and second contact holes 71 and 72. The first and second contact holes 71 and 72 expose the drain and storage electrodes 63 and 65, respectively. A pixel electrode 81 is formed on the passivation layer 70 at a pixel region defined by the gate and data lines 21 and 61. The pixel electrode 81 of indium-tin-oxide (ITO) or indium-zinc-oxide (IZO) is connected to the drain and storage electrodes 63 and 65 through the first and second contact holes 71 and 72, respectively.

In the fabricating process of the array substrate discussed above, the first and second contact holes 71 and 72 are formed by depositing and patterning the passivation layer 70. However, during the photolithography and etch process, the passivation layer can be contaminated by organic materials due to the incomplete drying after etching and cleaning process or impurities of the fabrication apparatus. In the following deposition process of ITO for the pixel electrode 81, this contamination weakens the adhesion between the passivation layer 70 and ITO film so that the etching solution for ITO film can permeate into the interface of the passivation layer 70 and ITO film. Therefore, the drain electrode 63 under the first contact hole 71 is easily corroded by the etching solution and the electric open circuit is created between the drain and pixel electrodes 63 and 81.

Moreover, since the drain and pixel electrodes 63 and 81 are connected through the first contact hole 71, a portion of the drain electrode 63 overlapping the pixel electrode 81 should have an area larger than a specific value. However, since the drain electrode 63 is opaque, the larger the area of overlapping drain electrode is, the lower the aperture ratio will be.

BRIEF SUMMARY OF THE INVENTION

Accordingly, the present invention is directed to an array substrate for a liquid crystal display device that substantially obviates one or more of the problems due to limitations and disadvantages of the related art.

An object of the present invention is to provide an array substrate for a liquid crystal device and a manufacturing method thereof that prevent deterioration between drain and pixel electrodes.

Another object of the present invention is to provide an array substrate for a liquid crystal device and a manufacturing method thereof that have an improved aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a substrate; gate and data lines perpendicular to each other on the substrate; a thin film transistor connected to the gate and data lines, the thin film transistor having a semiconductor layer, and source and drain electrodes facing and spaced apart from each other; a passivation layer over the gate and data lines and the thin film transistor, the passivation layer having a contact hole exposing a portion of top and side surfaces of the drain electrode; and a pixel electrode on the passivation layer, the pixel electrode connected to the drain electrode through the contact hole.

In another aspect of the present invention, an array substrate for a liquid crystal display device includes a substrate; gate and data lines perpendicular to each other on the substrate; a thin film transistor connected to the gate and data lines, the thin film transistor having a semiconductor layer, a plurality of ohmic contact layers, and source and drain electrodes; a passivation layer pattern on the data line and the thin film transistor, the passivation layer pattern exposing a portion of top and side surfaces of the drain electrode; and a pixel electrode connected to the drain electrode.

In another aspect of the present invention, a fabricating method of an array substrate for a liquid crystal display device includes forming a gate line on a substrate; forming a gate insulator on the gate line; forming a semiconductor layer on the gate insulator; forming an ohmic contact layer on the semiconductor layer; forming a data line and source and drain electrodes on the ohmic contact layer, the source electrode connected to the data line, the source and drain electrodes facing and spaced apart from each other; forming a passivation layer having a contact hole on the data line, source and drain electrodes, the contact hole exposing a portion of top and side surfaces of the drain electrode; and forming a pixel electrode on the passivation layer, the pixel electrode connected to the drain electrode through the contact hole.

In another aspect of the present invention, a fabricating method of an array substrate for a liquid crystal display device includes forming a gate line on a substrate with a first mask; subsequently depositing a gate insulator, an amorphous silicon layer, a doped amorphous silicon layer and a metal layer on the gate line; forming a semiconductor layer, a plurality of ohmic contact layers, a data line, and source and drain electrodes with a second mask; forming a passivation layer pattern on the source and drain electrodes with a third mask, the passivation layer pattern covering a crossing portion of the gate and data lines and exposing a portion of top and side surfaces of the drain electrode; and forming a pixel electrode connected to the drain electrode with a fourth mask.

It is to be understood that both the foregoing general description and the following detailed description are exemplary and explanatory and are intended to provide further explanation of the invention as claimed.

BRIEF DESCRIPTION OF THE DRAWINGS

The present invention will become more fully understood from the detailed description given hereinbelow and the accompanying drawings which are given by way of illustration only, and thus do not limit the present invention.

DETAILED DESCRIPTION OF PREFERRED EMBODIMENTS

Reference will now be made in detail to the preferred embodiments of the present invention, example of which is illustrated in the accompanying drawing.

Figure 1:
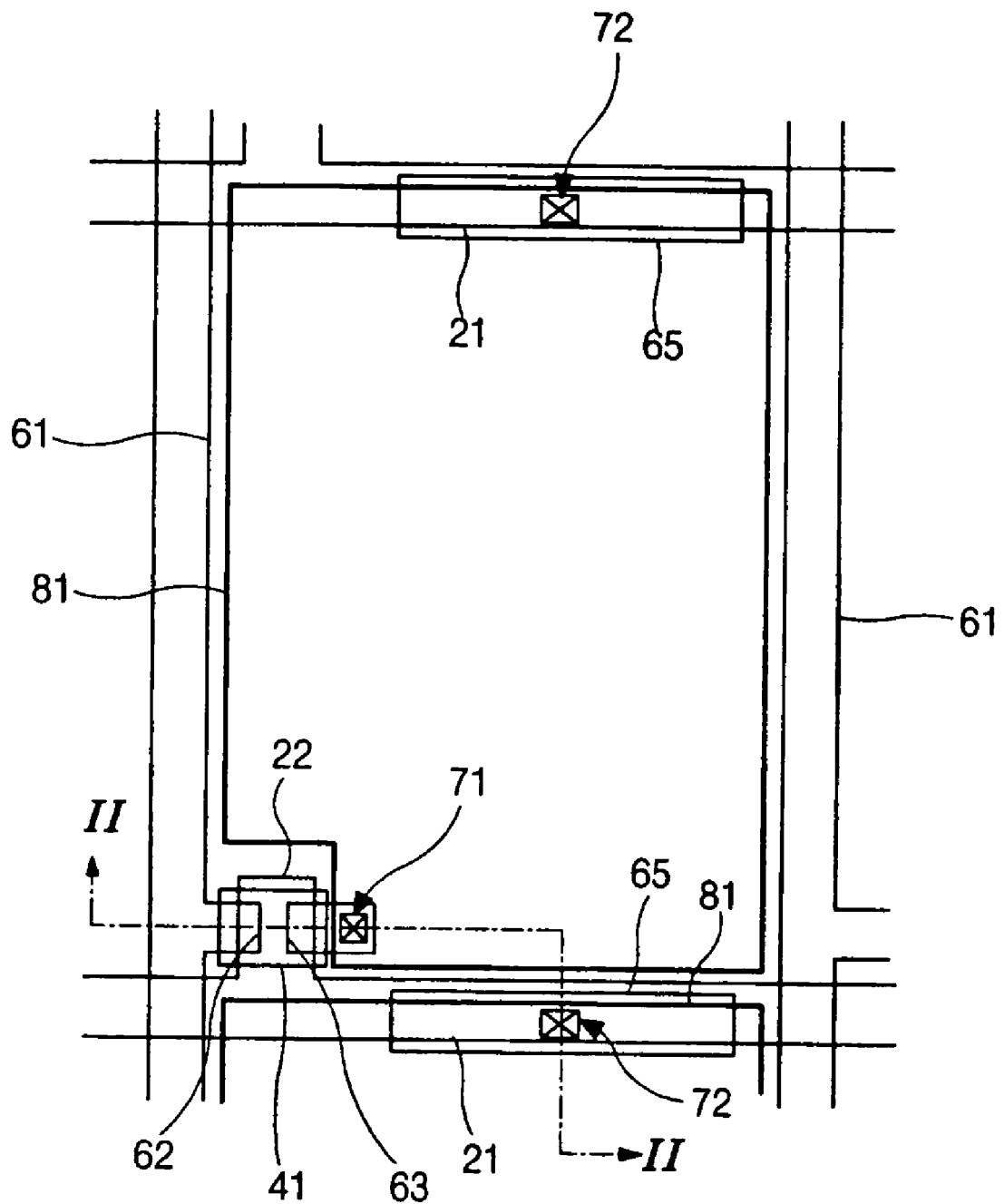
FIG. 1 is a schematic plan view of an array substrate for a conventional liquid crystal display device.
Figure 2:
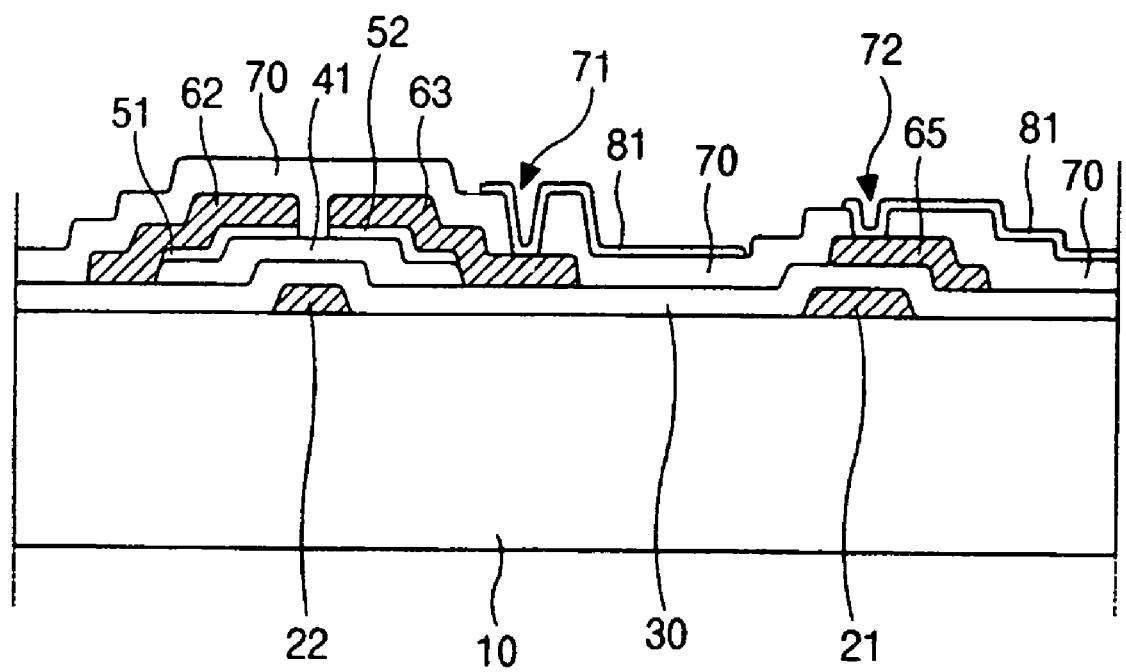
FIG. 2 is a schematic cross-sectional view taken along a line "II-II" of FIG. 1.
Figure 3:
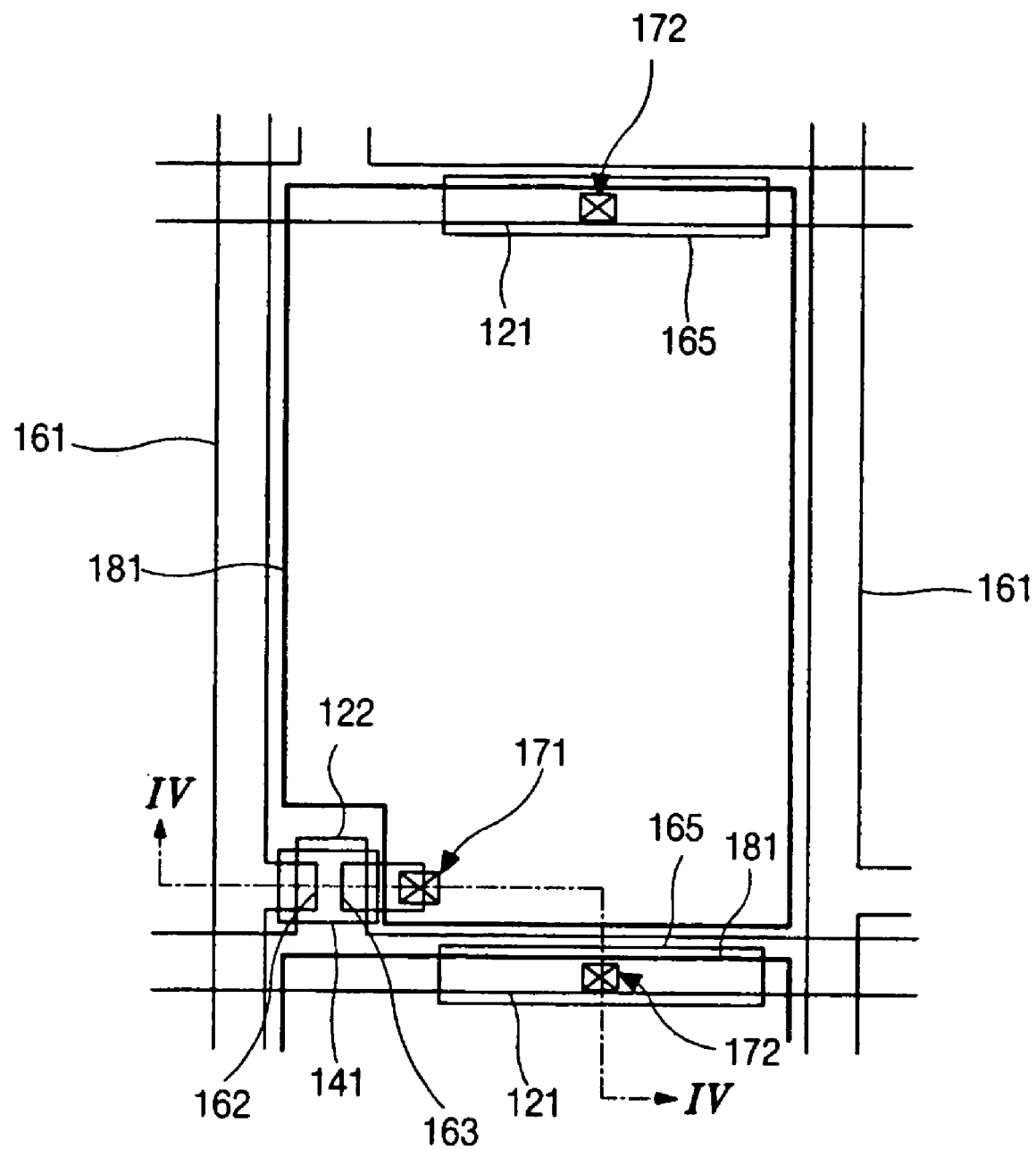
FIG. 3 is a schematic plan view of an array substrate for a liquid crystal display device according to a first embodiment of the present invention.

FIG. 3 is a schematic plan view of an array substrate for a liquid crystal display device according to a first embodiment of the present invention and FIGS. 4A to 4E are sequential schematic cross-sectional views taken along a line "IV-IV" of FIG. 3.

Figure 4A:
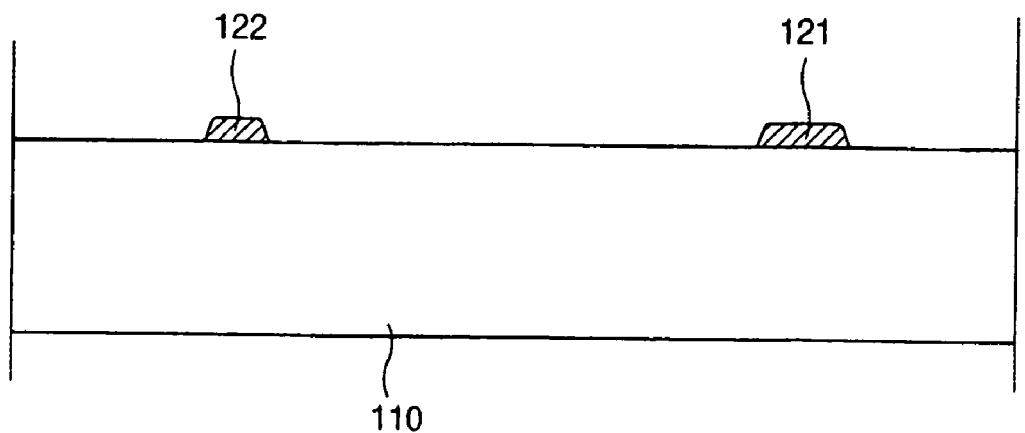
FIGS. 4A to 4E are sequential schematic cross-sectional views taken along a line "IV-IV" of FIG. 3.
Figure 4B:
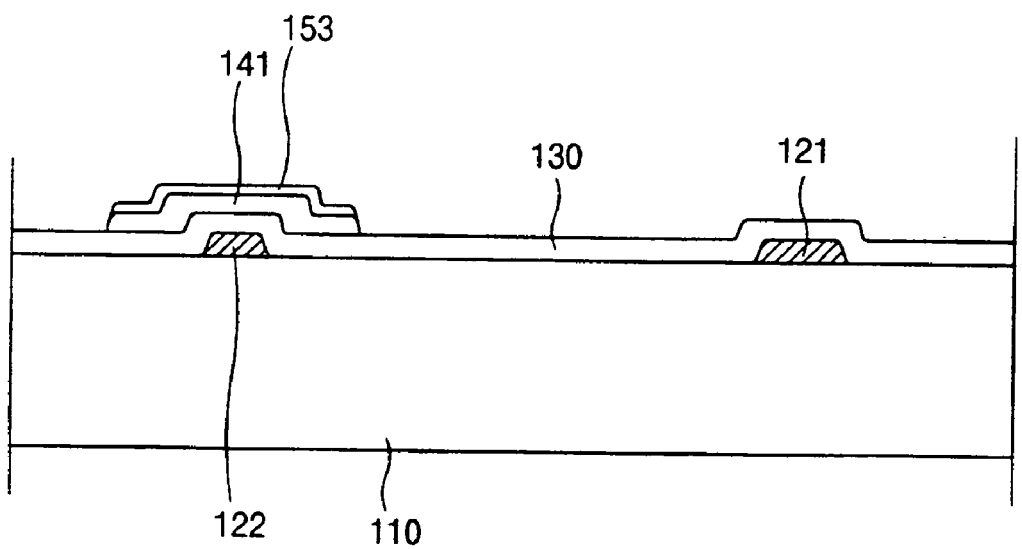
Figure 4C:
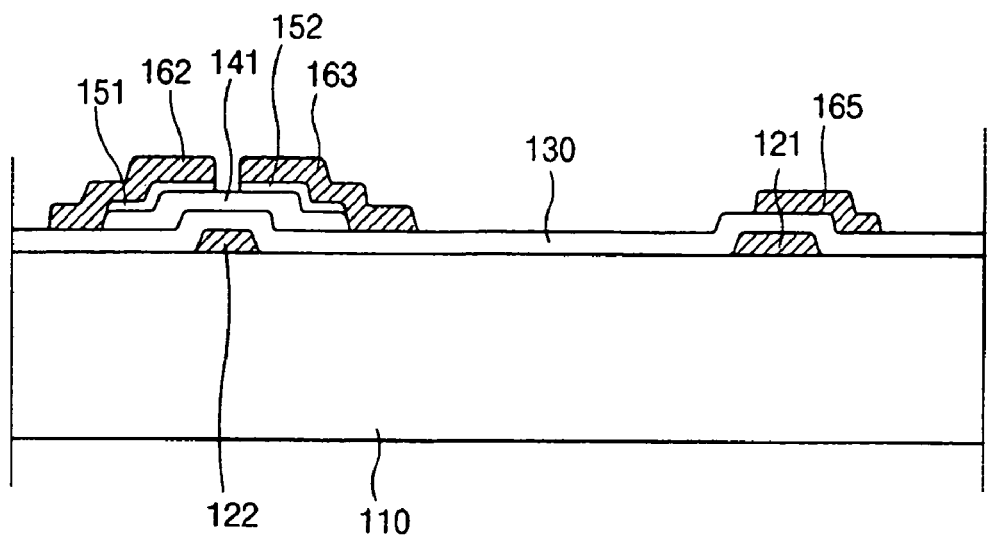
Figure 4D:
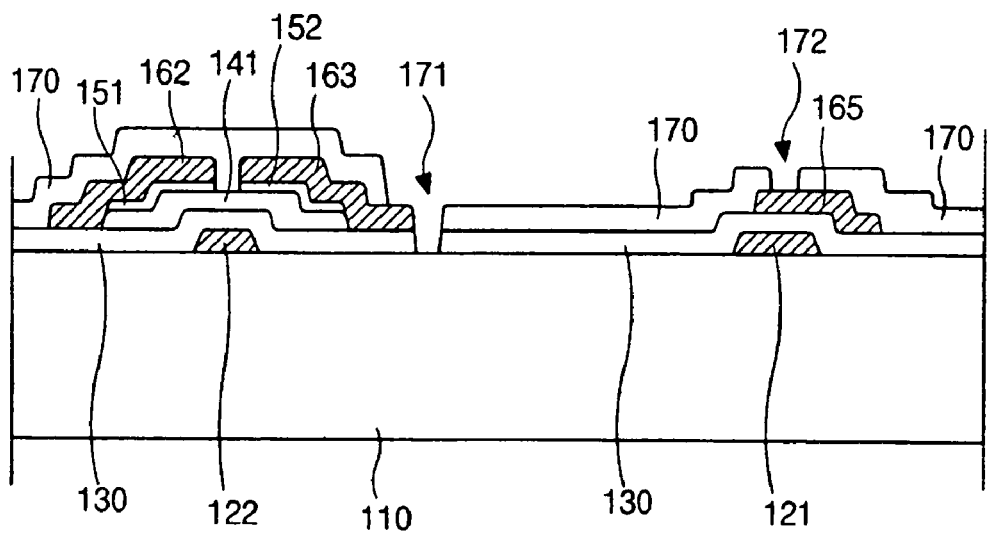
Figure 4E:
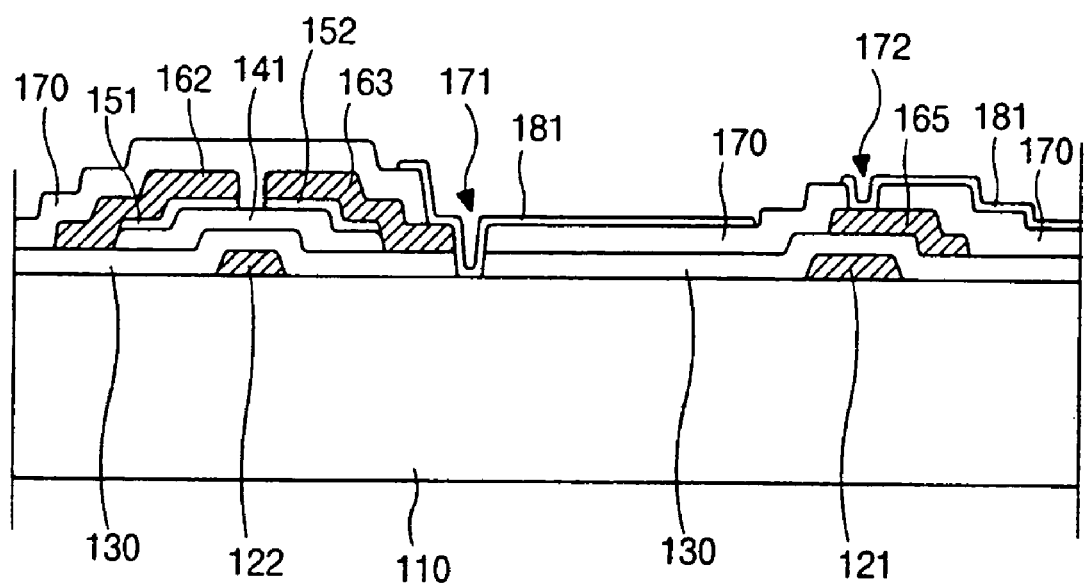

In FIGS. 3 and 4E, a gate line 121 along a row direction and a gate electrode 122 extended from the gate line 121 are formed on a substrate 110 of a transparent material such as glass. Then, a gate insulator 130 made of silicon nitride (SiNx), silicon oxide ($SiO_2$), or the like is formed on the gate line 121 and the gate electrode 122. Subsequently, an active layer 141 and an ohmic contact layer 151 and 152 are formed on the gate insulator 130. On the ohmic contact layer 151 and 152, a data line 161, source and drain electrodes 162 and 163 and a storage electrode 165 are formed. The data line 161 is disposed perpendicular to the gate line 121, the source electrode 162 is extended from the data line 161, the drain electrode 163 is facing and spaced apart from the source electrode 162, and the storage electrode 165 overlaps the gate line 121.

The data line 161, source and drain electrodes 162 and 163 and the storage electrode 165 are covered with a passivation layer 170 having first and second contact holes 171 and 172. The first and second contact holes 171 and 172 expose the drain and storage electrodes 163 and 165, respectively. Particularly, the first contact hole 171 exposes a portion of top and side surfaces of the drain electrode 163. Moreover, at a region adjacent to the exposed edge of the drain electrode 163, not only the passivation layer 170 but also the gate insulator 130 is etched. A pixel electrode 181 is formed on the passivation layer 170 at a pixel region defined by the gate and data lines 121 and 161. The pixel electrode 181 is connected to the drain and storage electrodes 163 and 165 through the first and second contact holes 171 and 172, respectively, where the pixel electrode 181 contacts the exposed portion of top and side surfaces of the drain electrode 162. On the other hand, the storage electrode 165 connected to the pixel electrode 181 forms a storage capacitor with the gate line 121 and the storage capacitor can be formed between the gate line 121 and the pixel electrode 181 without the storage electrode 165.

The method of forming the array substrate of FIG. 3 will now be discussed referring to FIGS. 4A-4E according to an embodiment of the present invention.

In FIG. 4A, a gate line 121 and a gate electrode 122 are formed on a substrate 110 by depositing and patterning a metallic material using a first mask. Although, the metallic material of good adhesion and low resistance is preferred, other types of metallic material may be used.

In FIG. 4B, after a gate insulator 130, an amorphous silicon and a doped amorphous silicon are subsequently deposited, an active layer 141 and an ohmic contact layer 153 are respectively formed over the gate electrode 122 by patterning the amorphous silicon and the doped amorphous silicon using photolithography and etch processes with a second mask.

In FIG. 4C, a data line 161 (of FIG. 3), source and drain electrodes 162 and 163 and a storage electrode 165 are formed by depositing and patterning a metallic material using a third mask. Ohmic contact layers 151 and 152 are formed by etching a portion of the ohmic contact layer 153 (doped amorphous silicon layer) between the source and drain electrodes 162 and 163.

In FIG. 4D, after a passivation layer 170 made of SiNx, $SiO_2$, or organic insulating material is formed on the entire surface of the substrate 110, first and second contact holes 171 and 172, which respectively expose portions of the drain and storage electrodes 163 and 165, are formed by patterning the passivation layer 170 using a fourth mask. Here, the first contact hole 171 exposes a portion of top and side surfaces of the drain electrode 163. Moreover, since the selectivity of etch rate between the passivation layer 170 and the gate insulator 130 is too low, a portion of the gate insulator 130 adjacent to the exposed edge of the drain electrode 163 is also etched so that a surface of the substrate 110 is exposed. In another embodiment, the first contact hole 171 can expose the entire surface of the drain electrode 163.

In FIG. 4E, a pixel electrode 181 is formed by depositing and patterning a transparent conductive material such as ITO or IZO using a fifth mask. The pixel electrode 181 is electrically connected to and contacts the drain and storage electrodes 163 and 165 through the first and second contact holes 171 and 172, respectively. Since the pixel electrode 181 contacts the exposed portion of top and side surfaces of the drain electrode 163, the electric open often caused by an etching solution can be prevented. Furthermore, since the portion of the side surface of the drain electrode 163 is also exposed and contacts the pixel electrode 181 through the first contact hole 171, the area of the top surface of the drain electrode 163 can be decreased which improves the aperture ratio of the LCD device.

However, since the photolithography and etch processes include many steps such as cleaning, deposition of photo resist (PR), exposure, development and etching, the fabricating process using five masks can have drawbacks of lengthy fabrication time and high cost. Therefore, a reduction in the number of masks used is desired and a second embodiment of the present invention implements this reduction in the number of masks used.

Figure 5:
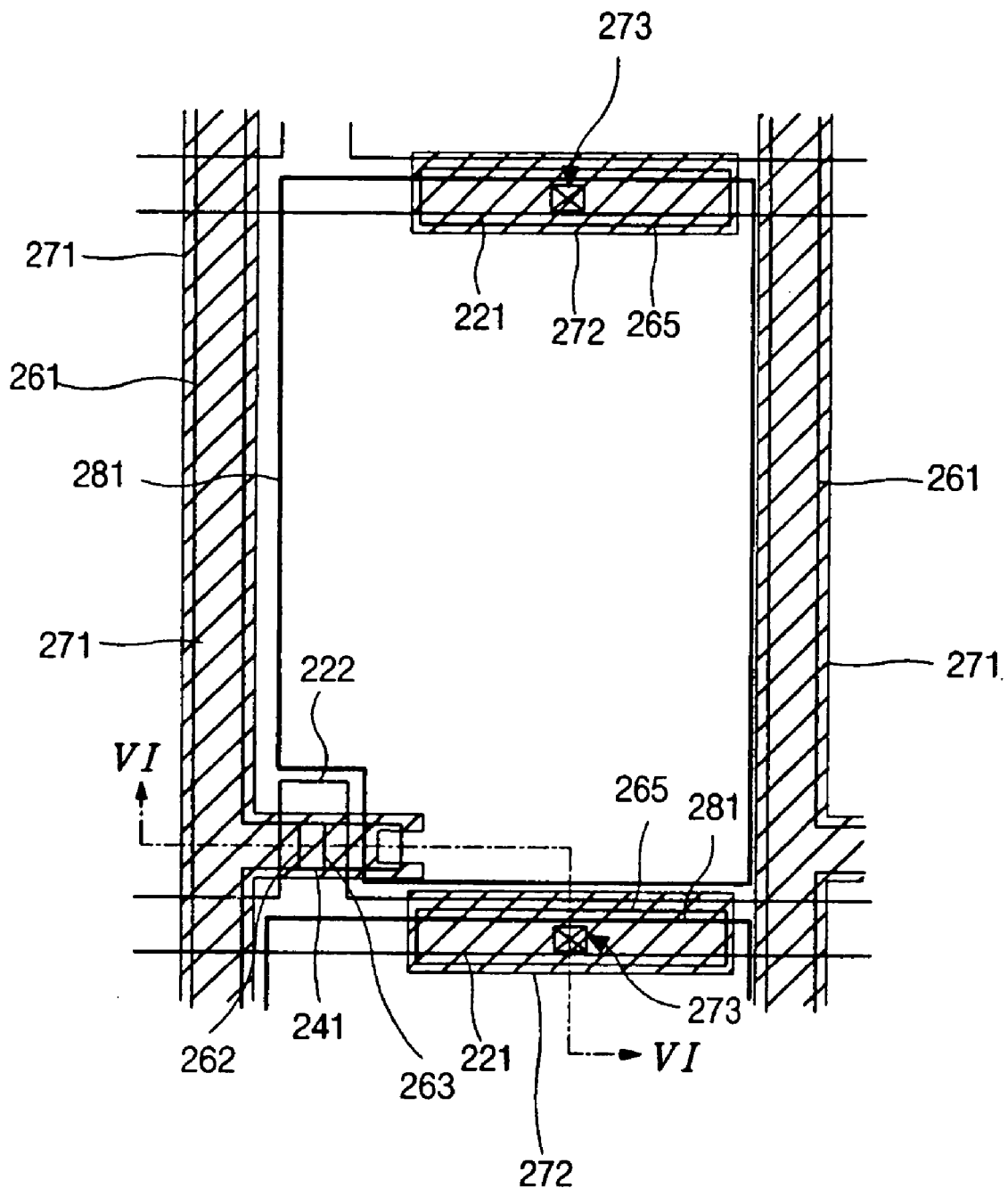
FIG. 5 is a schematic plan view of an array substrate for a liquid crystal display device according to a second embodiment of the present invention.

FIG. 5 is a schematic plan view of an array substrate for a liquid crystal display device according to a second embodiment of the present invention and FIGS. 6A to 6D are sequential schematic cross-sectional views taken along a line "VI-VI" of FIG. 5.

Figure 6A:
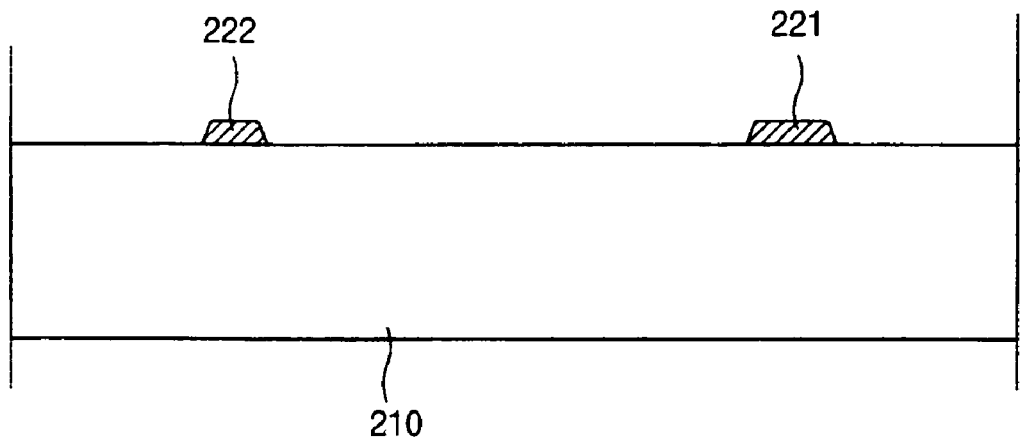
FIGS. 6A to 6D are sequential schematic cross-sectional views taken along a line "VI-VI" of FIG. 5.
Figure 6B:
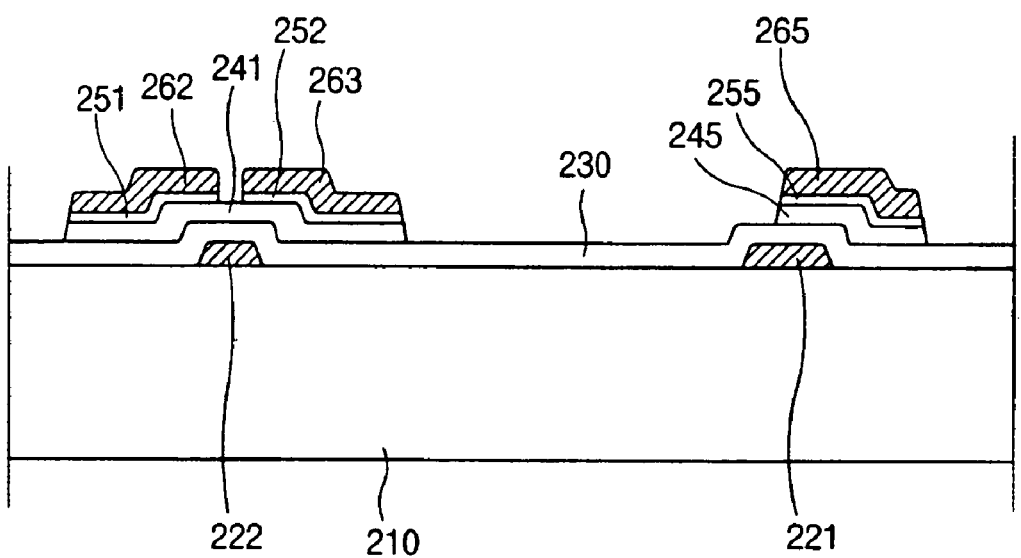
Figure 6C:
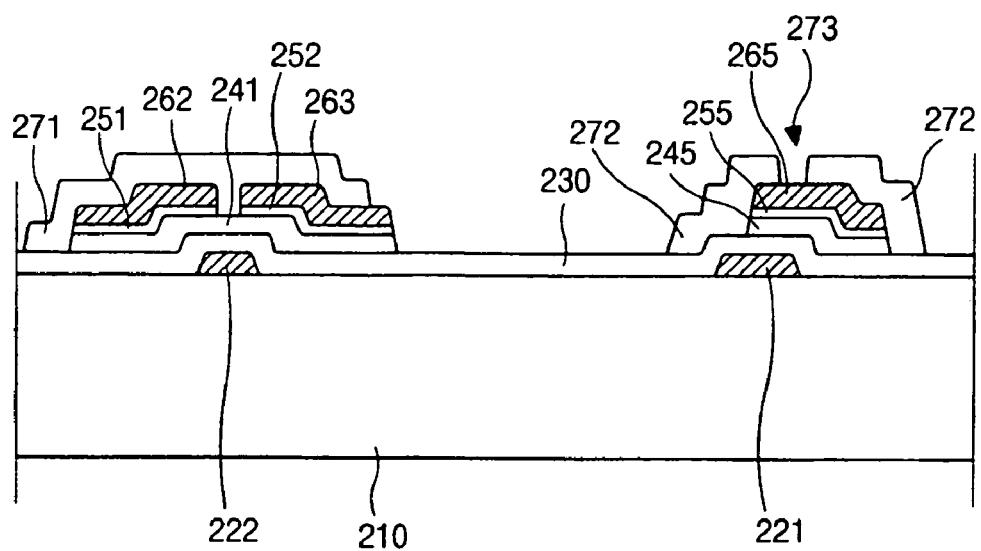
Figure 6D:
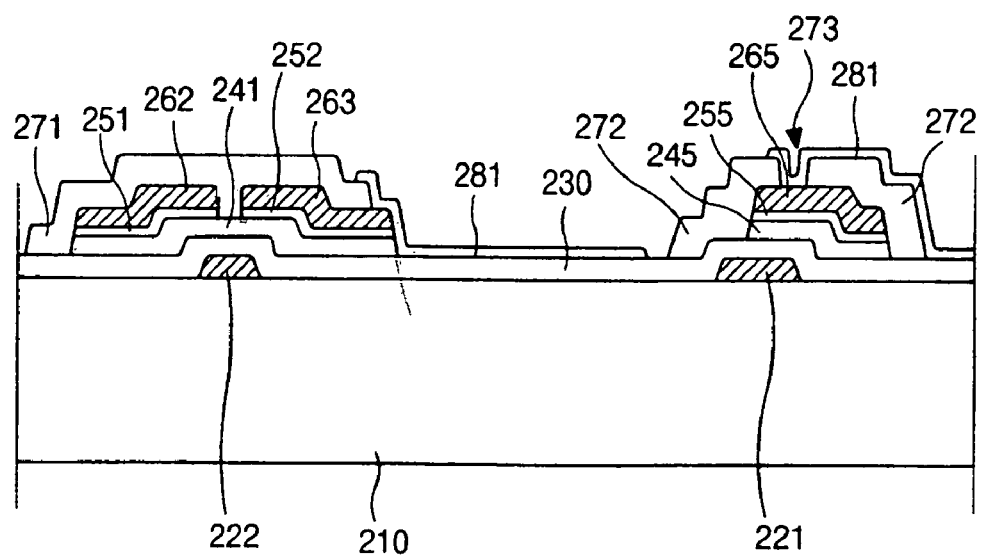

In FIGS. 5 and 6D, a gate line 221 along a row direction and a gate electrode 222 extended from the gate line 221 are formed on a substrate 210. Then, a gate insulator 230 is formed on the gate line 221 and the gate electrode 222. Semiconductor layers 241 and 245 are formed on the gate insulator 230 and ohmic contact layers 251, 252 and 255 are formed thereon. The semiconductor layer 241 over the gate electrode 222 becomes an active layer of a TFT (thin film transistor). On the ohmic contact layers 251, 252 and 255, a data line 261, source and drain electrodes 262 and 263 and a storage electrode 265 are formed. The data line 261 is disposed perpendicular to the gate line 221, the source electrode 262 is extended from the data line 261, the drain electrode 263 is facing and spaced apart from the source electrode 262, and the storage electrode 265 overlaps the gate line 221, thereby forming a storage capacitor. The ohmic contact layers 251 and 252 have the same plane surfaces as the data line 261, and source and drain electrodes 262 and 263. On the other hand, the semiconductor layer 241 has the same plane surface as the data line 261, the source and drain electrodes 262 and 263 except for a portion between the source and drain electrodes 262 and 263. A first passivation layer 271, which overlaps the drain electrode 263 and exposes a portion of top and side surfaces of the drain electrode 263, is formed on the data line 261 and the source and drain electrodes 262 and 263. On the storage electrode 265, a second passivation layer 272, which has a contact hole 273 exposing the storage electrode 265, is formed. Then, a pixel electrode 281 made of a transparent conductive material such as ITO or IZO is formed at a pixel region defined by the gate and data lines 221 and 261, where the pixel electrode 281 contacts the exposed portion of top and side surfaces of the drain electrode 263 and the storage electrode 265 through the contact hole 273. In another embodiment, the storage capacitor can be formed between the gate line 221 and the pixel electrode 281 without the storage electrode 265. In another embodiment, the second passivation layer 272 can be stripped out in the patterning process, whereby the pixel electrode 281 directly contacts the storage electrode 265 without the interposed passivation layer (272).

The method of forming the array substrate of FIG. 5 will now be discussed referring to FIGS. 6A-6D according to an embodiment of the present invention. In FIG. 6A, a gate line 221 and a gate electrode 222 are formed on a substrate 210 by depositing and patterning a metallic material or conductive material using a first mask.

In FIG. 6B, after a gate insulator 230, an amorphous silicon, a doped amorphous silicon and a metallic material are subsequently deposited on the entire surface of the substrate 210, a data line 261 (of FIG. 5), source and drain electrodes 262 and 263, a storage electrode 265, ohmic contact layers 251, 252 and 255 and semiconductor layers 241 and 245 are formed by pattering the silicons and metallic material using photolithography and etch processes with a second mask. Since the second mask includes fine patterns such as a plurality of slits at a corresponding portion between the source and drain electrodes 262 and 263, multiple layers can be etched at one time by a single etch process using diffraction exposure, whereby the number of masks used can be reduced significantly.

In FIG. 6C, first and second passivation layers 271 and 272 are formed by depositing and patterning SiNx, SiO$_2$, or an organic insulating material using a third mask. The first passivation layer 271, which overlaps the drain electrode 263 and exposes a portion of top and side surfaces of the drain electrode 263, is formed on the data line 261 and the source and drain electrodes 262 and 263. In another embodiment, the entire surface of the drain electrode 263 can be exposed. On the storage electrode 265, a second passivation layer 272, which has a contact hole 273 exposing the storage electrode 265, is formed. In another embodiment, the second passivation layer 272 or the contact hole 273 can be omitted as discussed above.

In FIG. 6D, a pixel electrode 281 is formed by depositing and patterning a transparent conductive material such as ITO or IZO using a fourth mask. The pixel electrode 281 contacts the exposed portion of top and side surfaces of the drain electrode 263 and the exposed portion of the storage electrode 265 through the contact hole 273.

Therefore, in the second embodiment, the array substrate manufacturing process is simplified by fabricating the array substrate using only four masks.

Although the passivation layer at the pixel region is removed in the second embodiment, the passivation layer can cover the entire surface of the substrate with a contact hole exposing a portion of top and side surfaces of the drain electrode.

It will be apparent to those skilled in the art that various modifications and variation can be made in the method of manufacturing a flat pane display device of the present invention without departing from the spirit or scope of the invention. Thus, it is intended that the present invention cover the modifications and variations of this invention provided they come within the scope of the appended claims and their equivalents.

What is claimed is:

1. A fabricating method of an array substrate for a liquid crystal display device, comprising:

forming a gate line on a substrate;

forming a gate insulator on the gate line;

forming an ohmic contact layer on the gate insulator;

forming a data line and source and drain electrodes on the ohmic contact layer, the source electrode being connected to the data line, the source and drain electrodes facing and spaced apart from each other;

forming a passivation layer having a contact hole on the data line and the source and drain electrodes, the contact hole exposing a portion of a side edge surface of the drain electrode, the contact hole defined through the passivation layer and the gate insulator;

forming a pixel electrode on the passivation layer, the pixel electrode being connected to the drain electrode through the contact hole; and forming a storage capacitor including a portion of the gate line as a first storage electrode, a portion of the gate insulator, and a second storage electrode having an island shape, wherein the second storage electrode is disposed directly contacting the gate insulator.

2. The fabricating method according to claim 1, wherein the ohmic contact layer, the data line, and the source and drain electrodes are formed using a single mask.

3. The fabricating method according to claim 1, wherein the contact hole exposes a portion of a top surface of the drain electrode.

4. A fabricating method of an array substrate for a liquid crystal display device, comprising:

forming a gate line on a substrate using a first mask;

subsequently depositing a gate insulator, an amorphous silicon layer, a doped amorphous silicon layer and a conductive layer on the gate line;

patterning the amorphous silicon layer, the doped amorphous silicon layer and the conductive layer using photolithography and etching processes with a second mask to form a semiconductor layer, a plurality of ohmic contact layers, a data line, source and drain electrodes and a storage electrode;

forming a first passivation layer pattern and a second passivation layer pattern using a third mask, the first passivation layer pattern on the source and drain electrodes, the first passivation layer pattern covering a crossing portion of the gate and the data lines and exposing a portion of a side edge surface of the drain electrode, the second passivation layer pattern on the storage electrode and including a contact hole exposing the storage electrode; and forming a pixel electrode connected to the drain electrode using a fourth mask, wherein a portion of the pixel electrode is formed directly on the gate insulator at a pixel region defined by the gate and data lines, and wherein the pixel electrode contacts the storage electrode through the contact hole.

5. The fabricating method according to claim 4, wherein the first passivation layer pattern further exposes a portion of a top surface of the drain electrode.

* * * * *